United States Patent
Kang

(10) Patent No.: US 10,008,262 B2
(45) Date of Patent: Jun. 26, 2018

(54) MEMORY AND ELECTRONIC DEVICE INCLUDING THE SAME

(71) Applicant: SK hynix Inc., Icheon (KR)

(72) Inventor: Seok-Joon Kang, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days. days.

(21) Appl. No.: 15/789,073

(22) Filed: Oct. 20, 2017

(65) Prior Publication Data

US 2018/0040372 A1  Feb. 8, 2018

Related U.S. Application Data

(62) Division of application No. 15/173,417, filed on Jun. 3, 2016, now Pat. No. 9,824,751.

(30) Foreign Application Priority Data

Dec. 1, 2015 (KR) .................. 10-2015-0169808

(51) Int. Cl.
| | |
|---|---|
| *G11C 13/00* | (2006.01) |
| *G06F 3/06* | (2006.01) |
| *G11C 11/16* | (2006.01) |

(52) U.S. Cl.
CPC .......... *G11C 13/004* (2013.01); *G06F 3/0604* (2013.01); *G06F 3/0659* (2013.01); *G06F 3/0679* (2013.01); *G11C 11/1673* (2013.01); *G11C 13/003* (2013.01); *G11C 13/0026* (2013.01); *G11C 13/0028* (2013.01); *G11C 13/0038* (2013.01); *G11C 13/0059* (2013.01); *G11C 13/0061* (2013.01); *G11C 13/0069* (2013.01); *G11C 2013/0045* (2013.01); *G11C 2013/0078* (2013.01); *G11C 2213/72* (2013.01); *G11C 2213/76* (2013.01)

(58) Field of Classification Search
CPC ............ G11C 13/0059; G11C 13/0069; G11C 13/0028; G11C 2013/0078
See application file for complete search history.

(56) References Cited

U.S. PATENT DOCUMENTS

| | | | | |
|---|---|---|---|---|
| 5,883,827 A | * | 3/1999 | Morgan | ............. G11C 13/0004 365/100 |
| 2002/0101758 A1 | * | 8/2002 | Baker | ..................... G11C 11/16 365/148 |
| 2006/0221678 A1 | * | 10/2006 | Bedeschi | ............ G11C 11/5678 365/163 |
| 2008/0094871 A1 | * | 4/2008 | Parkinson | ............ G11C 7/1006 365/100 |

(Continued)

FOREIGN PATENT DOCUMENTS

KR  10-2013-0069029 A  6/2013

*Primary Examiner* — Douglas King

(57) ABSTRACT

A semiconductor memory includes a cell array including a plurality of resistive memory cells in which a plurality of columns and a plurality of rows are arranged, a read voltage application circuit configured to apply a read voltage to a selected memory cell of the plurality of resistive memory cells, a sensing circuit configured to detect an amount of a current flowing through the selected memory cell and sense data, and an overcurrent prevention circuit configured to reduce voltage levels at both ends of the selected memory cell when an overcurrent flows through the selected memory cell.

7 Claims, 7 Drawing Sheets

(56) References Cited

U.S. PATENT DOCUMENTS

| | | | |
|---|---|---|---|
| 2008/0094892 A1* | 4/2008 | Fasoli | G11C 11/5678 365/185.03 |
| 2008/0117674 A1* | 5/2008 | Lee | G11C 5/147 365/185.2 |
| 2013/0235648 A1* | 9/2013 | Kim | G11C 13/0069 365/148 |
| 2015/0194209 A1* | 7/2015 | Wu | G11C 11/1673 365/148 |
| 2016/0071585 A1* | 3/2016 | Ogiwara | G11C 13/0038 365/163 |

* cited by examiner

MEMORY AND ELECTRONIC DEVICE INCLUDING THE SAME

CROSS-REFERENCE TO RELATED APPLICATIONS

The present application claims priority to U.S. patent application Ser. No. 15/173,417 filed Jun. 3, 2016, which claims priority of Korean Patent Application No. 10-2015-0169808, filed on Dec. 1, 2015, which is incorporated herein by reference in its entirety.

BACKGROUND

1. Field

Embodiments of the present disclosure relate to a memory circuit or device and an application thereof in an electronic device.

2. Description of the Related Art

Recently, research into next generation memory devices for substituting for a DRAM and a flash memory has been actively conducted. One of such next generation memories is a resistive memory device using a material capable of switching at least two resistance states different from each other through a rapid change in its resistance according to applied bias, that is, a variable resistance material, and its representative example may include a RRAM (Resistive Random Access Memory), a PCRAM (Phase-Change Random Access Memory), a MRAM (Magnetic Random Access Memory), a FRAM (Ferroelectric Random Access Memory) and the like.

Particularly, the resistive memory device constitutes a memory cell array with a cross point array structure. In the cross point array structure, a plurality of lower electrodes (for example, a plurality of row lines (word lines)) and a plurality of upper electrodes (for example, a plurality of column lines (bit lines)) are formed to cross each other and a memory cell, in which a variable resistance element and a selection element have been serially coupled to each other, is arranged at each crossing point thereof.

SUMMARY

Various embodiments are directed to provide a technology for stably reading or writing data of a resistive memory.

In an embodiment, an electronic device includes a semiconductor memory, and the semiconductor memory may include: a cell array including a plurality of resistive memory cells in which a plurality of columns and a plurality of rows are arranged; a read voltage application circuit configured to apply a read voltage to a selected memory cell of the plurality of resistive memory cells; a sensing circuit configured to detect an amount of a current flowing through the selected memory cell and sense data; and an overcurrent prevention unit configured to reduce voltage levels at both ends of the selected memory cell when an overcurrent flows through the selected memory cell.

Implementations of the above method may include one or more the following.

After a low resistance state of the selected memory cell is sensed by the sensing circuit, the overcurrent prevention unit may determine a current flowing through the selected memory cell as an overcurrent.

The read voltage application circuit may apply the read voltage to a bit line of the selected memory cell, and the sensing circuit comprises: a sensing node electrically connected to a word line of the selected memory cell; a current sinking unit configured to sink a read reference current from the sensing node; and a sensing unit configured to sense data in response to a voltage level of the sensing node.

The overcurrent prevention unit may pull-up drive the sensing node in response to a data sensing result of the sensing unit.

After the current sinking unit and the sensing unit are activated in a read operation, the overcurrent prevention unit may be activated, and a start point of activation of the read voltage application circuit may be from activation time points of the current sinking unit and the sensing unit to an activation time point of the overcurrent prevention unit.

Each of the plurality of resistive memory cells comprises: a variable resistance element having a high resistance state or a low resistance state according to a logical value of stored data; and a selection element serially coupled to the variable resistance element.

The electronic device may further include a microprocessor which includes: a control unit that is configured to receive a signal including a command from an outside of the microprocessor, and performs extracting, decoding of the command, or controlling input or output of a signal of microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

The electronic device may further comprise a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the resistance variable element is part of the auxiliary memory device or the main memory device in the processing system.

The electronic device may further comprise a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

In another aspect, an electronic device may include a semiconductor memory, and the semiconductor memory may include a cell array including a plurality of resistive memory cells in which a plurality of columns and a plurality of rows are arranged; a write driver configured to supply a write current to a selected memory cell of the plurality of resistive memory cells; and an overcurrent prevention unit configured to reduce voltage levels at both ends of the selected memory cell when an overcurrent flows through the selected memory cell.

The write driver may supply the write current to a bit line of the selected memory cell, and the semiconductor memory further comprises: a current sinking unit configured to sink a write reference current from a sensing node electrically connected to a word line of the selected memory cell.

The overcurrent prevention unit may determine that an overcurrent flows through the selected memory cell when a current flowing to the sensing node from the selected memory cell is larger than the write reference current.

After the current sinking unit and the sensing unit are activated in a write operation, the overcurrent prevention unit may be activated, and a start point of activation of the write driver may be from activation time points of the current sinking unit and the sensing unit to an activation time point of the overcurrent prevention unit.

The electronic device may further include a microprocessor which includes: a control unit that is configured to receive a signal including a command from an outside of the microprocessor, and performs extracting, decoding of the command, or controlling input or output of a signal of microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

The electronic device may further comprise a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the resistance variable element is part of the auxiliary memory device or the main memory device in the processing system.

The electronic device may further comprise a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

In accordance with embodiments, it is possible to stably read or write data of a resistive memory. Furthermore, in read and write operations of the resistive memory, it is possible to substantially prevent an overcurrent from flowing through a memory cell.

DETAILED DESCRIPTION

Figure 1:
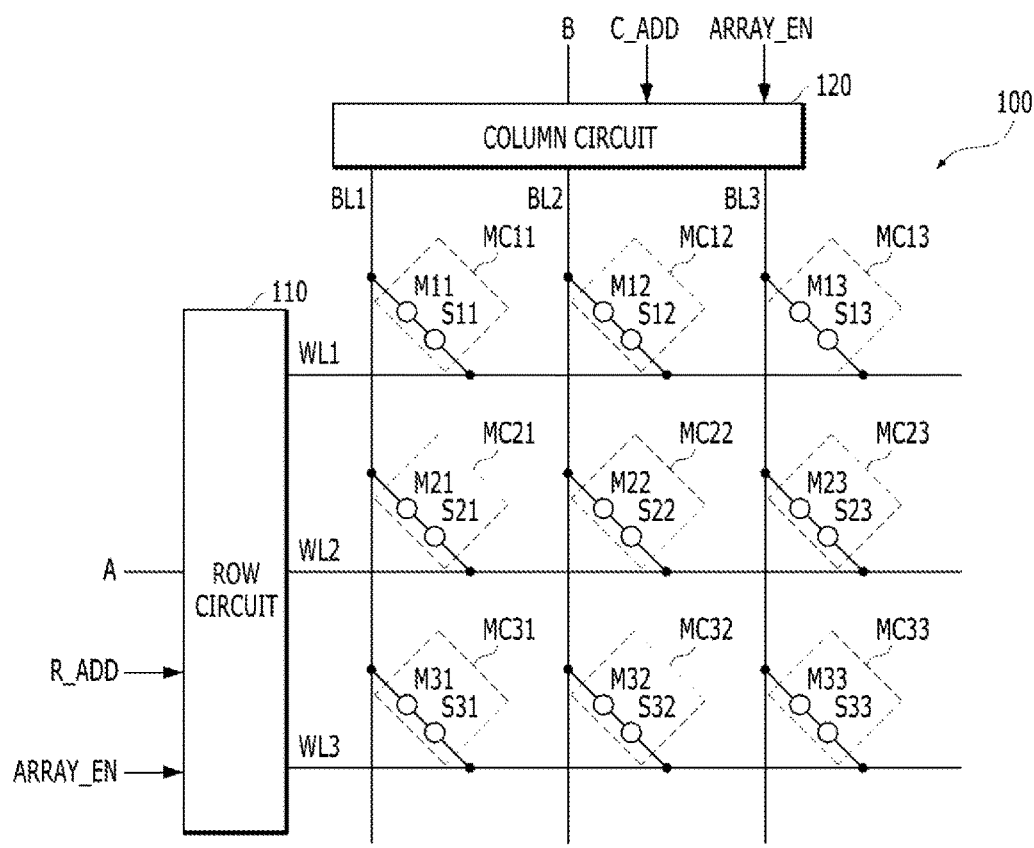
FIG. 1 is a diagram illustrating a cell array of a resistive memory in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 illustrates a cell array 100 of a resistive memory in accordance with an embodiment.

Referring to FIG. 1, the cell array 100 of the resistive memory may include a plurality of word lines WL1 to WL3 (also called row lines), a plurality of bit lines BL1 to BL3 (also called column lines), and memory cells MC11 to MC13, MC21 to MC23, and MC31 to MC33 disposed at crossing points of the plurality of word lines WL1 to WL3 and the plurality of bit lines BL1 to BL3. Furthermore, the cell array 100 may include a row circuit 110 for controlling the word lines WL1 to WL3 and a column circuit 120 for controlling the bit lines BL1 to BL3. The terms 'word lines WL1 to WL3' and 'bit lines BL1 to BL3' may be relative names for distinguishing the respective lines from each other. Therefore, in another embodiment, the row lines WL1 to WL3 in FIG. 1 may be called bit lines, and the column lines BL1 to BL3 in FIG. 1 may be called word lines.

The memory cells MC11 to MC13, MC21 to MC23, and MC31 to MC33 may include a resistive memory element M11 and a selection element S11, a resistive memory element M12 and a selection element S12, a resistive memory element M13 and a selection element S13, a resistive memory element M21 and a selection element S21, a resistive memory element M22 and a selection element S22, a resistive memory element M23 and a selection element S23, a resistive memory element M31 and a selection element S31, a resistive memory element M32 and a selection element S32, a resistive memory element M33 and a selection element S33, respectively. Each of the resistive memory elements M11 to M13, M21 to M23, and M31 to M33 may have a low resistance state or a high resistance state according to data stored therein. The resistive memory elements M11 to M13, M21 to M23, and M31 to M33 may include phase change memory elements, respectively. In this case, each resistive memory element may have a low resistance state when the resistive memory element is in a crystalline state, and may have a high resistance state when the resistive memory element is in an amorphous state.

Each of the selection elements S11 to S13, S21 to S23, and S31 to S33 may be turned on when a difference of voltage levels at first and second nodes (e.g., both ends) of a memory cell is equal to or greater than a predetermined threshold value, and may be turned off when the difference is smaller than the predetermined threshold value. In an embodiment, each of the selection elements S11 to S13, S21 to S23, and S31 to S33 may include a diode, an OTS (Ovonic Threshold Switch) element, or the like.

The row circuit 110 may electrically couple a word line, which is selected from the word lines WL1 to WL3 based on a row address R_ADD, to a first node A. The column circuit 120 may electrically couple a bit line, which is selected from the bit lines BL1 to BL3 based on a column address C_ADD, to a second node B. A memory cell coupled to the selected word line and the selected bit line is a selected memory cell. For example, when the word line WL2 and the bit line BL2 are selected, the memory cell MC22 becomes the selected memory cell, and both ends of the selected memory cell MC22 may be electrically connected to the first node A and the second node B through the row circuit 110 and the column circuit 120, respectively.

The row circuit 110 and the column circuit 120 may apply appropriate voltages to unselected word lines and unselected bit lines so that selection elements of unselected memory cells may substantially maintain a turn-off state. A cell array activation signal ARRAY_EN activates or deactivates the row circuit 110 and the column circuit 120. When the cell array activation signal ARRAY_EN is activated, the row circuit 110 and the column circuit 120 may operate as described above. When the cell array activation signal ARRAY_EN is deactivated, the row circuit 110 and the column circuit 120 may apply a certain voltage (for example, a ground voltage) to all the word lines WL1 to WL3 and all the bit lines BL1 to BL3, or may apply no voltage to all the word lines WL1 to WL3 and all the bit lines BL1 to BL3 such that the word lines WL1 to WL3 and the bit lines BL1 to BL3 are in a floating state.

FIG. 1 illustrates only three word lines WL1 to WL3 and three bit lines BL1 to BL3 for illustrative convenience. However, numerous word lines and numerous bit lines may be included in the cell array 100.

Figure 2:
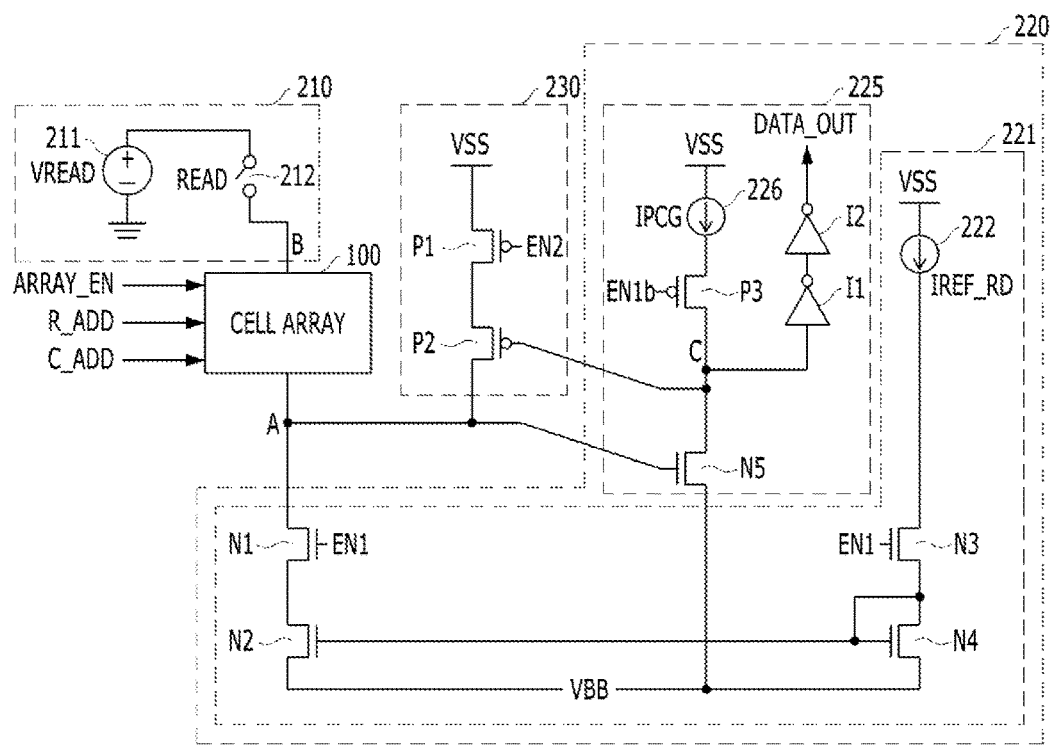
FIG. 2 is a diagram of a semiconductor memory device in accordance with an embodiment.

FIG. 2 illustrates a semiconductor memory device in accordance with an embodiment.

Referring to FIG. 2, the semiconductor memory device may include the cell array 100 of FIG. 1, a read voltage application circuit 210, a sensing circuit 220, and an overcurrent prevention circuit 230.

As described above with reference to FIG. 1, the cell array 100 may include a plurality of resistive memory cells, e.g., MC11 to MC13, MC21 to MC23, and MC31 to MC33, which are arranged at crossing points of a plurality of column lines and a plurality of row lines. When the cell array activation signal ARRAY_EN is activated, a memory cell, which is selected from the memory cells MC11 to MC13, MC21 to MC23, and MC31 to MC33 in the cell array 100 based on the row address R_ADD and the column address C_ADD, may be electrically connected to the first node A and the second node B.

The read voltage application circuit 210 may apply a read voltage VREAD to the second node B in a read operation. Since the second node B is electrically connected to a selected bit line to which the selected memory cell is coupled, it can be seen that the read voltage application circuit 210 applies the read voltage VREAD to the selected bit line. The read voltage application circuit 210 may include a voltage source 211 for supplying the read voltage VREAD and a switch 212 for supplying the read voltage VREAD to the second node B in response to a read signal READ which is activated in the read operation.

The sensing circuit 220 may detect an amount of a current flowing through the selected memory cell in the cell array 100, and sense data based on the detection result. Since the sensing circuit 220 detects the amount of the current flowing through the selected memory cell by sensing a voltage level at the first node A, the first node A may be called a sensing node. The sensing circuit 220 may include a current sinking unit 221 and a sensing unit 225. The current sinking unit sinks a current corresponding to a read reference current IREF_RD from the first node A, and the sensing unit 225 senses data stored in the selected memory cell based on the voltage level at the first node A.

The current sinking unit 221 may sink the current corresponding to the read reference current IREF_RD from the first node A when a first activation signal EN1 is activated. An amount of the read reference current IREF_RD may be greater than an amount of a current flowing through the selected memory cell when a resistive memory element of the selected memory cell is in a high resistance state, and may be smaller than an amount of a current flowing through the selected memory cell when the resistive memory element of the selected memory cell is in a low resistance state.

The current sinking unit 221 may include NMOS transistors N1 and N3 for activating or deactivating the current sinking unit 221 in response to the first activation signal EN1, a current source 222 for supplying the read reference current IREF_RD, and NMOS transistors N2 and N4 for mirroring the read reference current IREF_RD supplied from the current source 222 toward the first node A. A negative voltage VBB may be used in the current sinking unit 221, and may have a voltage level lower than that of a ground voltage VSS.

The sensing unit 225 may sense data stored in the selected memory cell by detecting the voltage level at the first node A. The sensing unit 225 may include a current source 226 for supplying a precharge current IPCG, a PMOS transistor P3 for activating or deactivating the sensing unit 225 in response to an inverted first activation signal EN1$b$, an NMOS transistor N5 for pull-down driving a third node C in response to the voltage level at the first node A, and inverters I1 and I2 for outputting data DATA_OUT sensed based on a voltage level at the third node C. The precharge current IPCG is used to precharge the third node C to a high level, and an amount of the precharge current IPCG may be set to be small such that the third node C has a low level when the NMOS transistor N5 is turned on.

The overcurrent prevention circuit 230 may reduce a difference of voltage levels at both ends of the selected memory cell when an overcurrent flows through the selected memory cell, thereby substantially preventing the overcurrent from flowing through the selected memory cell. The overcurrent prevention circuit 230 may determine a current flowing through the selected memory cell as an overcurrent when the low resistance state of the selected memory cell is sensed by the sensing circuit 220. That is, when it is determined that the selected memory cell is in the low resistance state, since a large amount of current needs not to flow through the selected memory cell, the current flowing through the selected memory cell in the low resistance state is determined as the overcurrent. The overcurrent prevention circuit 230 may include a PMOS transistor P1 for activating or deactivating the overcurrent prevention circuit 230 in response to a second activation signal EN2, and a PMOS transistor P2 for pull-up driving the first node A in response to a voltage level at the third node C.

Figure 3:
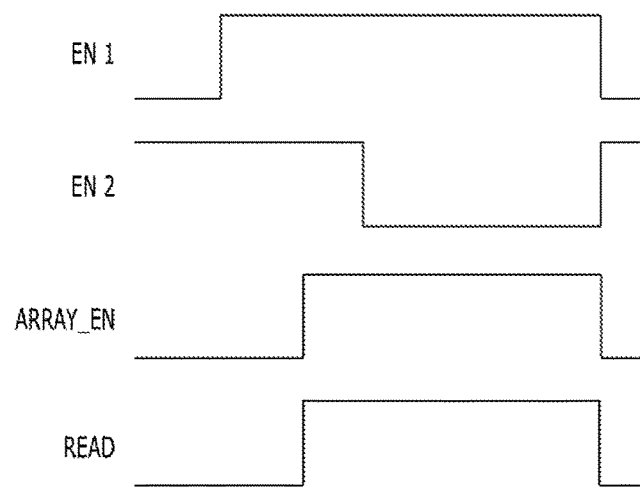
FIG. 3 is a timing diagram for explaining a read operation of the semiconductor memory device of FIG. 2.

FIG. 3 is a timing diagram for explaining the read operation of the semiconductor memory device of FIG. 2. With reference to FIG. 2 and FIG. 3, the read operation of the semiconductor memory device will be described.

Referring to FIG. 3, when the first activation signal EN1 is activated to a high level, the current sinking unit 221 is activated, and thus the first node A may be initialized to a level approximately the same as that of the negative voltage VBB. When the first activation signal EN1 is activated to the high level, since the inverted first activation signal EN1$b$ is activated to a low level, the sensing unit 225 is also activated, and thus the third node C may be precharged to a high level, e.g., the ground voltage VSS that is higher than the negative voltage VBB. After the first activation signal EN1 is activated, the read signal READ is activated to a high level. When the read signal READ is activated and thus the switch 212 is turned on, the read voltage application circuit 210 may supply the read voltage VREAD to the second node B. At this time, the cell array activation signal ARRAY_EN is also activated, such that both ends of the selected memory cell in the cell array 100 may be coupled to the first node A and the second node B. Subsequently, the second activation signal EN2 is activated to a low level, such that the overcurrent prevention circuit 230 is activated.

When the resistive memory element of the selected memory cell is in a high resistance state, an amount of a current sourced to the first node A from the selected memory cell may be smaller than the amount of the read reference current IREF_RD sunk from the first node A. Consequently, the first node A continuously maintains a level approximately the same as that of the negative voltage VBB, and the third node C substantially maintains the high level, such that the data DATA_OUT may be outputted as a high level. That is, data of the selected memory cell may be determined to be 'high.'

On the other hand, when the resistive memory element of the selected memory cell is in a low resistance state, an amount of a current sourced to the first node A from the selected memory cell may be greater than the amount of the read reference current IREF_RD sunk from the first node A. Consequently, a voltage level of the first node A becomes higher than that of the negative voltage VBB, and thus the NMOS transistor N5 is turned on, such that the third node C is transitioned from the high level to a low level. Accordingly, the data DATA_OUT may be outputted as a low level.

When the resistive memory element of the selected memory cell is in the low resistance state, since an overcurrent flows through the selected memory cell, data of the selected memory cell may be affected by the overcurrent, or a data retention time may be reduced. The overcurrent prevention circuit 230 is activated to substantially prevent such an issue by pull-up driving the first node A with the ground voltage VSS to reduce a difference of the voltage levels at both ends of the selected memory cell, in response to the transition of the third node C from the high level to the low level. That is, the overcurrent prevention circuit 230 pull-up drives the first node A in response to the sensing of the low resistance state of the resistive memory element of the selected memory cell, since the PMOS transistor P2 is turned on when the third node C is transitioned from the high level to the low level. By pull-up driving the first node A, a selection element of the selected memory cell is turned off, and thus substantially zero current may flow through the selected memory cell. Therefore, even when the resistive memory element of the selected memory cell is in the low resistance state, only a minimum current required for sensing data flows through the selected memory cell. As a result, an unnecessary current may be substantially prevented from flowing through the selected memory cell by the pull-up driving operation of the overcurrent prevention circuit 230.

When the read operation is completed, the read signal READ, the first activation signal EN1, the second activation signal EN2, and the cell array activation signal ARRAY_EN may be deactivated.

FIG. 2 illustrates that the sensing circuit 220 and the overcurrent prevention circuit 230 use the negative voltage VBB as a low voltage and use the ground voltage VSS as a high voltage. However, this is for illustrative purposes only, embodiments are not limited thereto. In an embodiment, any voltage lower than the high voltage VSS may be used as a low voltage, and any voltage higher than the low voltage and lower than the read voltage VREAD may be used as a high voltage.

FIG. 3 illustrates that the read signal READ and the cell array activation signal ARRAY_EN are activated after the first activation signal EN1 is activated and before the second activation signal EN2 is activated. The read signal READ and the cell array activation signal ARRAY_EN may be activated at an arbitrary point of time in a time period from an activation point of time of the first activation signal EN1 to an activation point of time of the second activation signal EN2.

Figure 4:
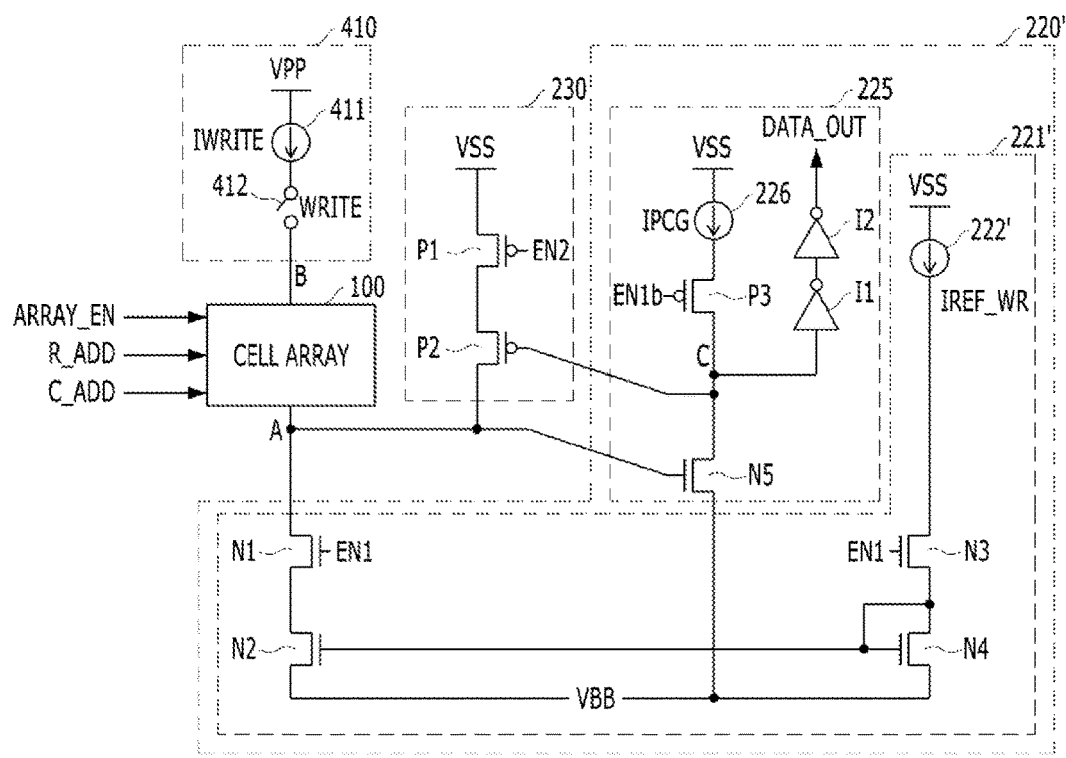
FIG. 4 is a diagram of a semiconductor memory device in accordance with another embodiment.

FIG. 4 illustrates a semiconductor memory device in accordance with another embodiment. A write operation of the semiconductor memory device will be described with reference to FIG. 4.

Referring to FIG. 4, the semiconductor memory device may include a cell array 100, a write driver 410, a sensing circuit 220', and an overcurrent prevention circuit 230.

The cell array 100, the sensing circuit 220', and the overcurrent prevention circuit 230 may be substantially the same as corresponding components described in FIG. 2. However, a current source 222' of a current sinking unit 221' of the sensing circuit 220' supplies a write reference current IREF_WR while the current source 222 in FIG. 2 supplies the read reference current IREF_RD. The write reference current IREF_WR may serve as a reference current for determining an overcurrent flowing in the write operation. That is, the write reference current IREF_WR may have an amount greater than a general current amount flowing through a selected memory cell in the write operation. In the write operation, data DATA_OUT outputted from the sensing circuit 220 may be ignored.

The write driver 410 may supply a write current IWRITE to the second node B of the cell array 100 in the write operation. Since the second node B is electrically connected to a bit line of a selected memory cell, the write current IWRITE may flow through the selected memory cell. By applying the write current IWRITE to the selected memory cell, a resistive memory element of the selected memory cell may enter a liquid state. After that, if the amount of the write current IWRITE is slowly reduced, the resistive memory element may enter a crystalline state, and thus may have a low resistance state. On the other hand, after the write current IWRITE is applied to the selected memory cell and thus the resistive memory element of the selected memory cell enters the liquid state, if the amount of the write current IWRITE is quickly reduced, the resistive memory element may enter an amorphous state, and thus may have a high resistance state.

The write driver 410 may include a current source 411 for supplying the write current IWRITE and a switch 412 for supplying the write current IWRITE to the second node B in response to a write signal WRITE which is activated in the write operation. In FIG. 4, a high voltage VPP that is generated by pumping a power supply voltage VDD is supplied to the semiconductor memory device. The high voltage VPP may have a level higher than that of the power supply voltage VDD.

Figure 5:
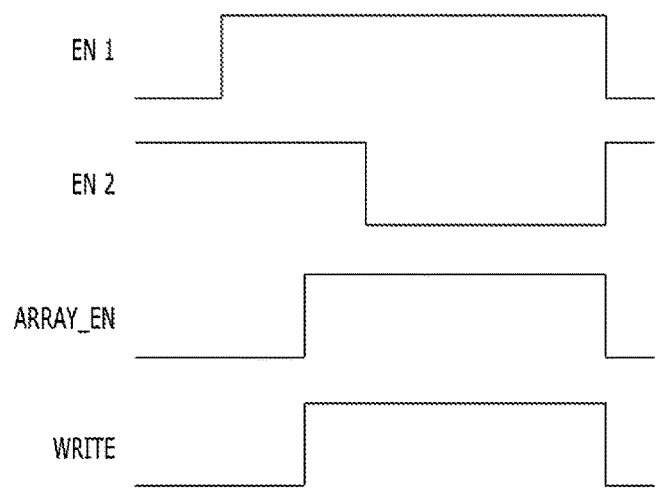
FIG. 5 is a timing diagram for explaining a write operation of the semiconductor memory device of FIG. 4.

FIG. 5 is a timing diagram for explaining the write operation of the semiconductor memory device of FIG. 4. With reference to FIG. 4 and FIG. 5, the write operation of the semiconductor memory device will be described.

Referring to FIG. 5, when the first activation signal EN1 is activated to a high level such that the current sinking unit 221' is activated, the first node A may be initialized to a level approximately the same as that of the negative voltage VBB. When the first activation signal EN1 is activated to the high level, since the inverted first activation signal EN1b is activated to a low level, the sensing unit 225 is also activated, and thus the third node C may be precharged to a high level VSS. After the first activation signal EN1 is activated, the write signal WRITE is activated to a high level. In response to the activation of the write signal WRITE, the write driver 410 may supply the write current IWRITE to the second node B. At this time, the cell array activation signal ARRAY_EN is also activated, such that both ends of the selected memory cell in the cell array 100 may be coupled to the first node A and the second node B. Then, the second activation signal EN2 is activated to a low level, and thus the overcurrent prevention circuit 230 may be activated.

As the write current IWRITE flows through the selected memory cell, the resistive memory element of the selected memory cell may be written to a high resistance state or a low resistance state according to the intensity and pattern of the write current IWRITE. When a current greater than the write reference current IREF_WR flows through the selected memory cell during the write operation, a voltage level at the first node A becomes high, such that a voltage level at the third node C may be transitioned from the high level to a low level. At this time, the overcurrent prevention circuit 230 may determine that an overcurrent flows through the selected memory cell. In response to the transition of the voltage level at the third node C from the high level to the low level, the overcurrent prevention circuit 230 may pull-up drive the first node A with the ground voltage VSS. Consequently, a difference of voltage levels at both ends of the selected memory cell is reduced so that an overcurrent may be prevented from flowing through the selected memory cell.

When the write operation is completed, the write signal WRITE, the first activation signal EN1, the second activation signal EN2, and the cell array activation signal ARRAY_EN may be deactivated.

FIG. 5 illustrates that the write signal WRITE and the cell array activation signal ARRAY_EN are activated after the first activation signal EN1 is activated and before the second activation signal EN2 is activated. The write signal WRITE and the cell array activation signal ARRAY_EN may be activated at an arbitrary point of time in a time period from an activation point of time of the first activation signal EN1 to an activation point of time of the second activation signal EN2.

The above and other memory circuits or semiconductor devices based on the disclosed technology can be used in a range of devices or systems. FIGS. 6-10 provide some examples of devices or systems that can implement the memory circuits disclosed herein.

Figure 6:
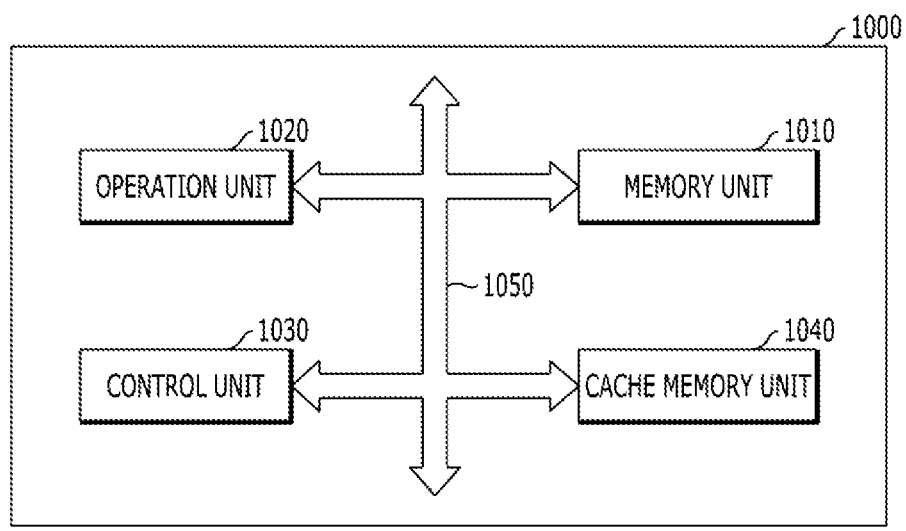
FIG. 6 shows an example of a configuration diagram of a microprocessor implementing memory circuitry based on the disclosed technology.

FIG. 6 shows an example of a configuration diagram of a microprocessor based on another implementation of the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described memory circuits in accordance with the implementations. For example, the memory unit 1010 implementation may include a cell array including a plurality of resistive memory cells arranged in a plurality of columns and a plurality of rows, a read voltage application circuit configured to apply a read voltage to a selected memory cell of the plurality of resistive memory cells, a sensing circuit configured to detect an amount of a current flowing through the selected memory cell and sense data, and an overcurrent prevention circuit configured to reduce a difference of voltage levels at both ends of the selected memory cell when an overcurrent flows through the selected memory cell. Through this, the read operation of the memory unit 1010 may be improved. Since the memory unit 1010 according to the present implementation may be improved in operating precision, the microprocessor 1000 may be improved in performance.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
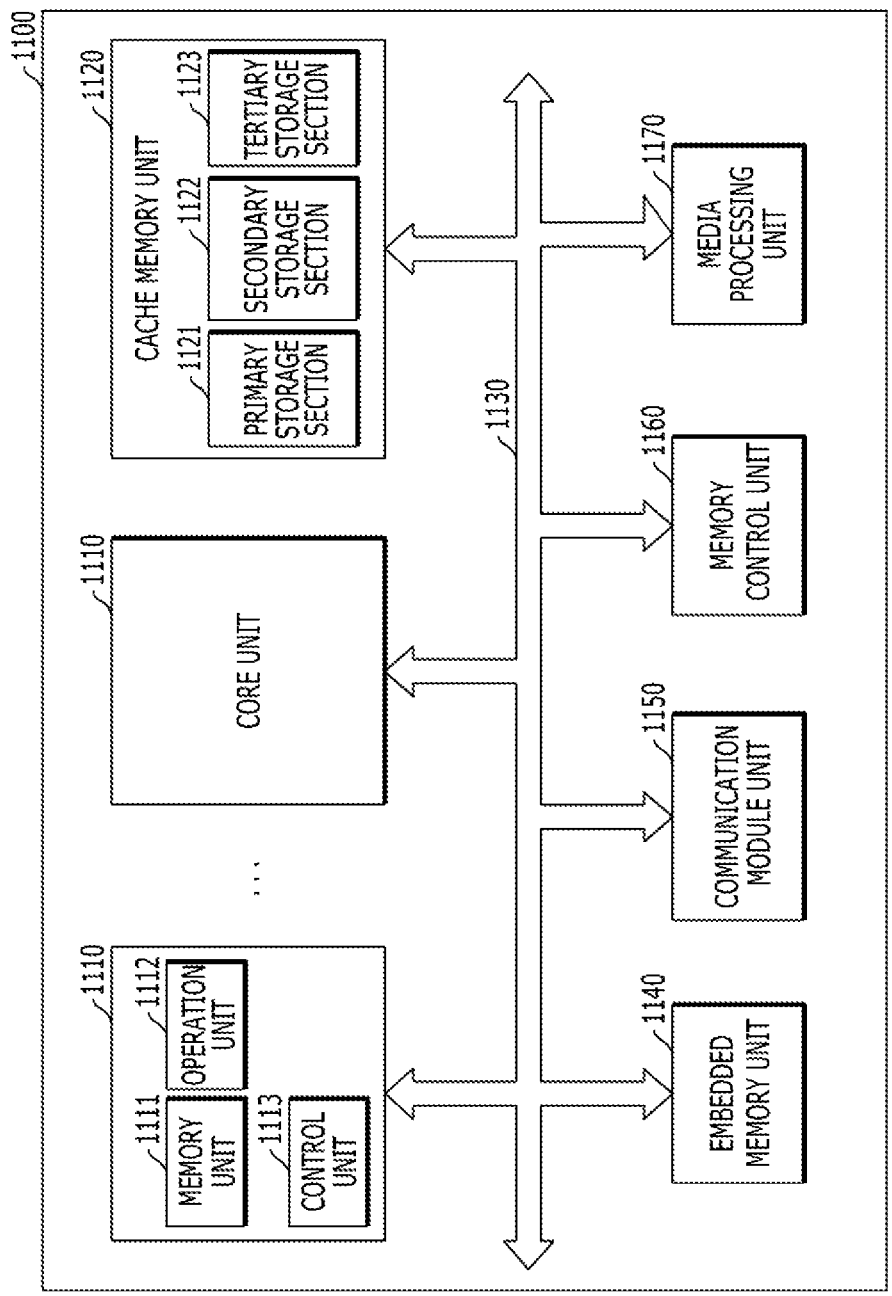
FIG. 7 shows an example of a configuration diagram of a processor implementing memory circuitry based on the disclosed technology.

FIG. 7 is a configuration diagram of a processor based on another implementation of the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described memory circuits in accordance with the implementations. For example, the cache memory unit 1120 implementation may include a cell array including a plurality of resistive memory cells arranged in a plurality of columns and a plurality of rows, a read voltage application circuit configured to apply a read voltage to a selected memory cell of the plurality of resistive memory cells, a sensing circuit configured to detect an amount of a current flowing through the selected memory cell and sense data, and an overcurrent prevention circuit configured to reduce a difference of voltage levels at both ends of the selected memory cell when an overcurrent flows through the selected memory cell. Through this, the read operation of the cache memory unit 1120 may be improved. Since the cache memory unit 1120 according to the present implementation may be improved in operating precision, the core unit 1110 may be improved in performance.

Although it was shown in FIG. 7 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
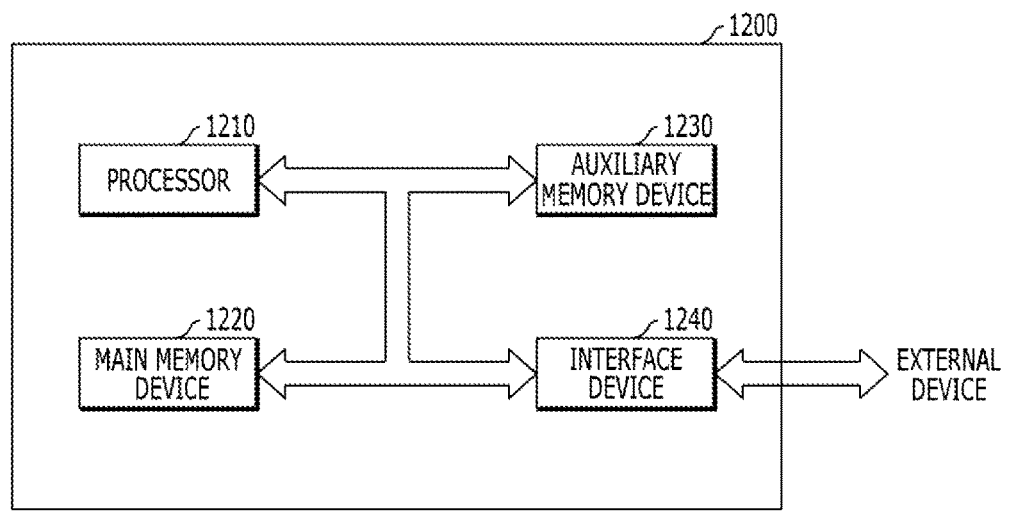
FIG. 8 shows an example of a configuration diagram of a system implementing memory circuitry based on the disclosed technology.

FIG. 8 is a configuration diagram of a system based on another implementation of the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 implementation may include a cell array including a plurality of resistive memory cells arranged in a plurality of columns and a plurality of rows, a read voltage application circuit configured to apply a read voltage to a selected memory cell of the plurality of resistive memory cells, a sensing circuit configured to detect an amount of a current flowing through the selected memory cell and sense data, and an overcurrent prevention circuit configured to reduce a difference of voltage levels at both ends of the selected memory cell when an overcurrent flows through the selected memory cell. Through this, the operating precision of the main memory device 1220 may be improved. Since the main memory device 1220 according to the present implementation may be improved in operating precision, the system 1200 may be improved in portability and performance.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 implementation may include a cell array including a plurality of resistive memory cells arranged in a plurality of columns and a plurality of rows, a read voltage application circuit configured to apply a read voltage to a selected memory cell of the plurality of resistive memory cells, a sensing circuit configured to detect an amount of a current flowing through the selected memory cell and sense data, and an overcurrent prevention circuit configured to reduce a difference of voltage levels at both ends of the selected memory cell when an overcurrent flows through the selected memory cell. Through this, the operating precision of the auxiliary memory device 1230 may be improved. Since the auxiliary memory device 1230 according to the present implementation may be improved in operating precision, the system 1200 may be improved in performance.

Also, the auxiliary memory device 1230 may further include a data storage system (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
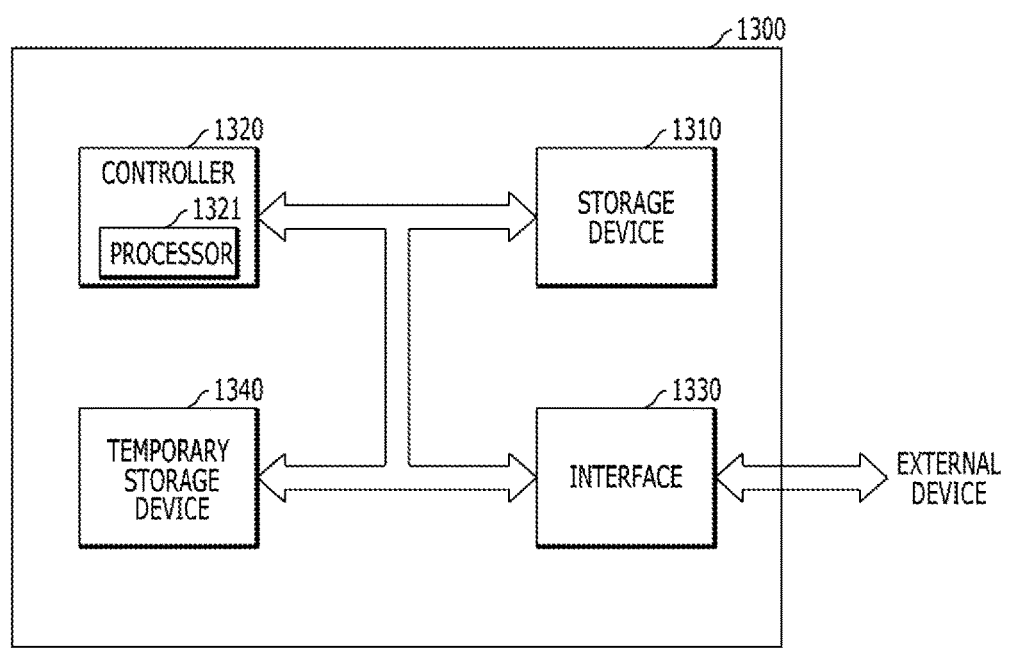
FIG. 9 shows an example of a configuration diagram of a data storage system implementing memory circuitry based on the disclosed technology.

FIG. 9 is a configuration diagram of a data storage system based on another implementation of the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other. The temporary storage device 1340 can store data temporarily implementation for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 implementation may include a cell array including a plurality of resistive memory cells arranged in a plurality of columns and a plurality of rows, a read voltage application circuit configured to apply a read voltage to a selected memory cell of the plurality of resistive memory cells, a sensing circuit configured to detect an amount of a current flowing through the selected memory cell and sense data, and an overcurrent prevention circuit configured to reduce a difference of voltage levels at both ends of the selected memory cell when an overcurrent flows through the selected memory cell. Since the storage device 1310 or the temporary storage device 1340 according to the present implementation may be improved in operating precision, the data storage system 1300 may be improved in performance.

Figure 10:
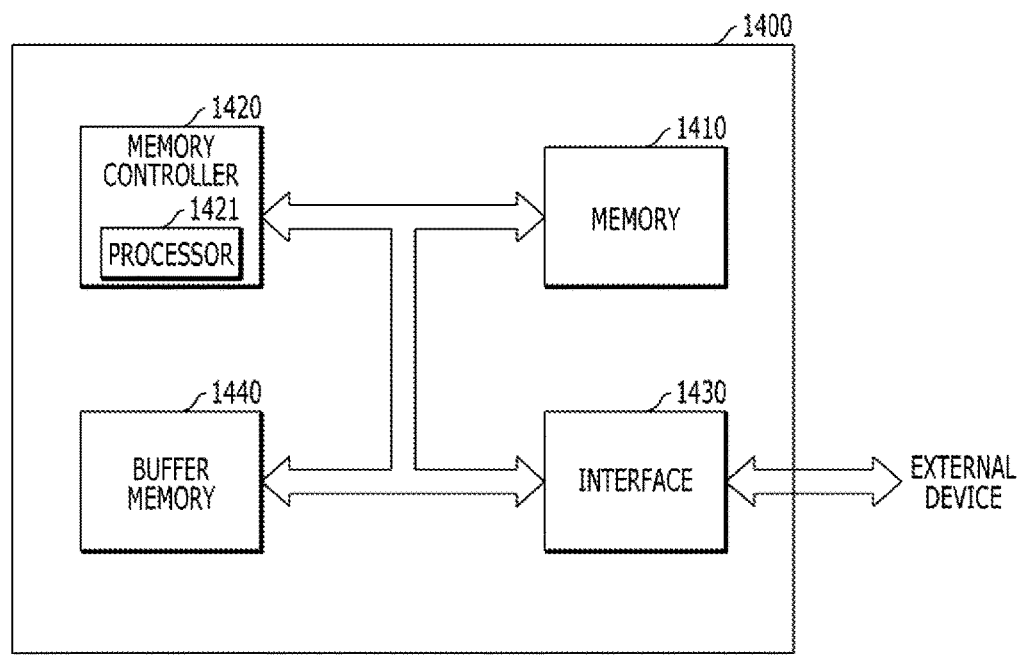
FIG. 10 shows an example of a configuration diagram of a memory system implementing memory circuitry based on the disclosed technology.

FIG. 10 is a configuration diagram of a memory system based on another implementation of the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 implementation may include a cell array including a plurality of resistive memory cells arranged in a plurality of columns and a plurality of rows, a read voltage application circuit configured to apply a read voltage to a selected memory cell of the plurality of resistive memory cells, a sensing circuit configured to detect an amount of a current flowing through the selected memory cell and sense data, and an overcurrent prevention circuit configured to reduce a difference of voltage levels at both ends of the selected memory cell when an overcurrent flows through the selected memory cell. Through this, read operation of the memory 1410 may be improved. Since the memory 1410 according to the present implementation may be improved in operating precision, the memory system 1400 may be improved in performance.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described memory circuits in accordance with the implementations. The buffer memory 1440 implementation may include a cell array including a plurality of resistive memory cells arranged in a plurality of columns and a plurality of rows, a read voltage application circuit configured to apply a read voltage to a selected memory cell of the plurality of resistive memory cells, a sensing circuit configured to detect an amount of a current flowing through the selected memory cell and sense data, and an overcurrent prevention circuit configured to reduce a difference of voltage levels at both ends of the selected memory cell when an overcurrent flows through the selected memory cell. Through this, read operation of the buffer memory 1440 may be improved. Since the buffer memory 1440 according to the present implementation may be improved in operating precision, the memory system 1400 may be improved in performance.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device including a semiconductor memory, wherein the semiconductor memory comprises:
    a cell array including a plurality of resistive memory cells, the plurality of resistive memory cells being arranged in a plurality of columns and a plurality of rows;
    a write driver configured to supply a write current to a bit line coupled to a selected memory cell of the plurality of resistive memory cells;
    a current sinking circuit configured to sink a write reference current from a sensing node that is electrically connected to a word line coupled to the selected memory cell; and
    an overcurrent prevention circuit configured to reduce a difference of voltage levels at first and second nodes of the selected memory cell when a current flowing to the sensing node from the selected memory cell is greater than the write reference current.

2. The electronic device of claim 1, wherein, after the current sinking circuit is activated in a write operation, the overcurrent prevention circuit is activated, and the write driver is activated at a point of time that is in a time period from an activation point of time of the current sinking circuit to an activation point of time of the overcurrent prevention circuit.

3. The electronic device according to claim 1, further comprising a microprocessor which includes:
    a control unit that is configured to receive a signal including a command from an outside of the microprocessor, and performs extracting, decoding of the command, or controlling input or output of a signal of microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory unit that includes the resistance variable element is part of the memory unit in the microprocessor.

4. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory unit that includes the resistance variable element is part of the cache memory unit in the processor.

5. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the resistance variable element is part of the auxiliary memory device or the main memory device in the processing system.

6. The electronic device according to claim 1, further comprising a data storage system which includes:
- a storage device configured to store data and conserve stored data regardless of power supply;
- a controller configured to control input and output of data to and from the storage device according to a command inputted form an outside;
- a temporary storage device configured to temporarily store data exchanged between the storage device and the outside; and
- an interface configured to perform communication between at least one of the storage device, the controller and the temporary storage device and the outside, wherein the semiconductor memory unit that includes the resistance variable element is part of the storage device or the temporary storage device in the data storage system.

7. The electronic device according to claim 1, further comprising a memory system which includes:
- a memory configured to store data and conserve stored data regardless of power supply;
- a memory controller configured to control input and output of data to and from the memory according to a command inputted form an outside;
- a buffer memory configured to buffer data exchanged between the memory and the outside; and
- an interface configured to perform communication between at least one of the memory, the memory controller and the buffer memory and the outside, wherein the semiconductor memory unit that includes the resistance variable element is part of the memory or the buffer memory in the memory system.

* * * * *